United States Patent
Dreps et al.

(10) Patent No.: US 7,202,723 B2
(45) Date of Patent: Apr. 10, 2007

(54) ADJUSTABLE SWITCHPOINT RECEIVER

(75) Inventors: Daniel Mark Dreps, Georgetown, TX (US); John Cummings Schiff, Austin, TX (US); Glen A. Wiedemeier, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 10/960,568

(22) Filed: Oct. 7, 2004

(65) Prior Publication Data

US 2006/0076995 A1  Apr. 13, 2006

(51) Int. Cl.
*H03K 3/00* (2006.01)

(52) U.S. Cl. ....................................... 327/205

(58) Field of Classification Search ................ 327/112, 327/205–206, 407, 18–20, 185; 326/57–58, 326/85
See application file for complete search history.

(56) References Cited

U.S. PATENT DOCUMENTS

| | | | |
|---|---|---|---|
| 5,966,032 A | 10/1999 | Elrabaa et al. | |
| 6,008,680 A * | 12/1999 | Kyles et al. | 327/277 |
| 6,084,426 A | 7/2000 | Allen | |
| 6,275,082 B1 | 8/2001 | Kiehl et al. | |
| 6,452,436 B1 * | 9/2002 | Leip | 327/407 |
| 6,724,596 B2 * | 4/2004 | Wade | 361/93.1 |
| 6,735,543 B2 | 5/2004 | Douskey et al. | |
| 6,903,523 B2 * | 6/2005 | Peterson | 318/138 |
| 2002/0070774 A1 | 6/2002 | Deas et al. | |

\* cited by examiner

*Primary Examiner*—My-Trang Nu Ton
(74) *Attorney, Agent, or Firm*—Casimer K. Salys; Dillon & Yudell LLP

(57) ABSTRACT

A signal detector circuit and digital signal receiver implementing the same. In one embodiment the digital signal receiver includes a switch point detector having a detector output and including a transistor array comprising one or more pull-up branches and one or more pull-down branches. A switch point control circuit is coupled to the switch point detector. The switch point control circuit generates branch enable signals for selectively enabling or disabling said one or more pull-up branches and said one or more pull-down branches in a detector output polarity dependent manner.

17 Claims, 2 Drawing Sheets

ADJUSTABLE SWITCHPOINT RECEIVER

BACKGROUND OF THE INVENTION

1. Technical Field

The present invention relates generally to signal interfaces, and in particular to an adjustable digital signal receiver. More particularly, the present invention relates to a circuit and device for adjustably setting switch points in a digital signal receiver in a hysterisis or anti-hysterisis mode.

2. Description of the Related Art

In addition to on-board processing, storage and logic modules, digital hardware devices such as integrated circuit (IC) chips typically include signal coupling interface circuitry to facilitate reliable, high-frequency inter-device signaling. Digital signal receivers/detectors are commonly included among such inter-module signaling interface devices. In general, a digital signal receiver includes circuit means for detecting a digital signal from a noisy input signal and re-generating the signal to remove noise or other signal distortion that may be introduced over a transmission path. As utilized in a chip-to-chip digital transmission application, a digital signal receiver performs a signal detection function for eliminating or minimizing signal distortion introduced over a signal line across a printed circuit board.

Fundamentally, a digital signal receiver includes circuit means for distinguishing between the binary signal levels. To this end, the receiver comprises detection means for determining the point in time and direction of the logic level transitions. Accurate detection and regeneration of a received digital signal therefore requires correspondingly accurate detection of the signal transition threshold levels or switch points. A common type of digital signal receiver employs reference level comparison techniques for determining the switch point of an incoming digital signal. Generally, a comparator or differential-type receiver includes a Vref level which is compared with the incoming signal to detect the switch points. However, maintaining DC reference levels within each of many onboard digital signal receivers presents substantial thermal dissipation problems given the increasing number and speed of current inter-chip signaling bus connections.

Another approach to detecting digital signals utilizes basic complementary metal oxide semiconductor (CMOS) inverter technology to reconstitute an incoming signal that may be degraded such as by rolloff. As is well-known in the art, a basic CMOS inverter comprises complementary logic devices in the form of a P-type field effect transistor (PFET) pull-up net source-to-drain coupled to an N-field effect transistor (NFET) pull-down net. Its complementary design enables a CMOS inverter to detect and switch at approximately the mid-transition voltage level of the input signal. However, accurate switch point detection requires precise correspondence between the inverter switch point and the received signal transition midpoint, such as vdd/2. Therefore, even slight manufacturing variations or runtime operating variations over temperature or device wear can introduce significant distortion in received signal detection. Furthermore, conventional CMOS type digital receivers are unable to compensate for shifts in the incoming signal level caused by noise or other system environmental factors. Even a very slight DC shift in the incoming signal may result in significant distortion even with a precisely manufactured CMOS receiver.

Attempts to address the foregoing problems relating to device and/or environmental signal distortions factors and the desire for high-speed, low-power characteristics of CMOS has led to the development of "elastic" interfaces, in which the timing of the individual signal line receiver circuits can be adjusted to accommodate the individual line variations and device tolerances. An example of such a receiver design is described in U.S. Pat. No. 6,084,426, issued to Allen. The receiver disclosed by Allen is a compensated CMOS receiver comprising an inverter having controllable compensation legs that enables the receiver switch point to be adjusted in conformity with a target reference switch point level.

While addressing some of the foregoing issues, the tunable receiver disclosed by Allen does not adequately address problems relating to intermittent noise or signal disturbances. Furthermore, a noisy high-speed link may require almost continuous "recalibrations" using the technique disclosed by Allen, thus increasing the signal processing required for switch point adjustment as well as the likelihood of recalibration errors.

It can therefore be appreciated that a need exists for a digital signal receiver device and system that overcomes the foregoing problems. The present invention addresses these and other needs unresolved by the prior art.

SUMMARY OF THE INVENTION

A signal detector circuit and digital signal receiver implementing the same are disclosed herein. In one embodiment the digital signal receiver includes a switch point detector having a detector output and including a transistor array comprising one or more pull-up branches and one or more pull-down branches. A switch point control circuit is coupled to the switch point detector. The switch point control circuit generates branch enable signals for selectively enabling or disabling said one or more pull-up branches and said one or more pull-down branches in a detector output polarity dependent manner.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT(S)

The present invention is directed to a receiver/detector circuit that provides adjustable control of transition-dependent switch point thresholds without the need for maintaining a threshold comparison voltage level. The present invention employs a switch point control feedback circuit and a switch point detector circuit having individually controllable pull-up and pull-down branches to provide a dynamically tunable receiver circuit having adjustable hysteretic switch point thresholds. The switch point control circuit generates branch enable signals that provide individual controllability of the pull-up and pull-down branches to set the detector switch points in a detector output polarity dependent manner. That is, the branch enable signals are generated to implement a branch enablement configuration for setting and adjusting a specified hysterisis or anti-hysterisis switch point value. The desired hysterisis or anti-hysterisis value may be pre-determined and calibrated relative to a reference hysterisis or anti-hysterisis value. The adjustment branches of the switch point detector circuit are configured using hysteretic mode select and level adjust inputs and to provide coarse and fine adjustments as needed to maintain the operative switch point voltages within selected tolerances.

Figure 1:
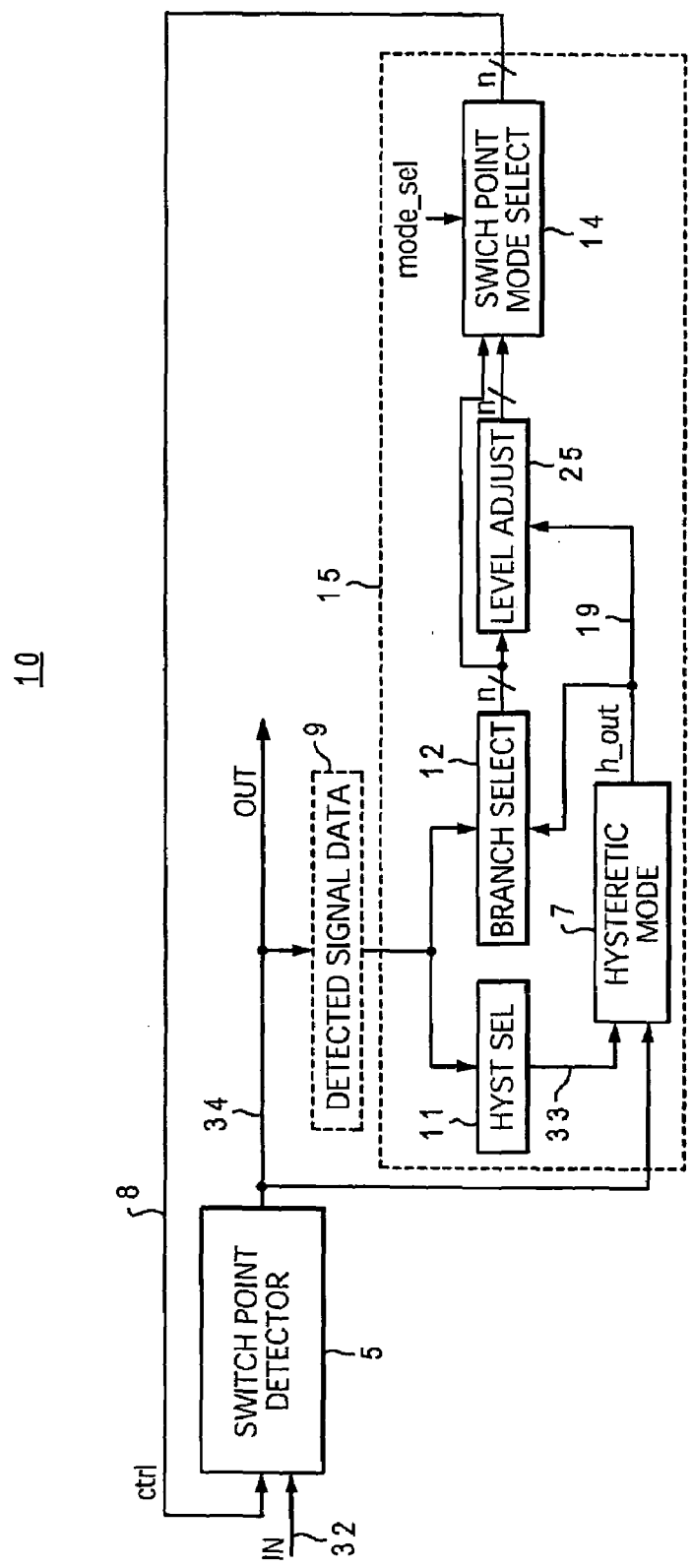
FIG. 1 is a high-level block diagram illustrating a digital signal receiver in accordance with the present invention.

Referring now to the figures, wherein like reference numerals refer to like and corresponding parts throughout, and in particular with reference to FIG. 1, there is depicted a high-level block diagram illustrating a digital signal receiver 10 in accordance with the present invention. Digital signal receiver 10 generally comprises a switch point detector 5 coupled to a switch point control circuit 15. Switch point detector 5 includes a signal detect input 32 for receiving an input signal to be detected and a control path input 8 coupled to the output of control circuit 15. As depicted and explained in further detail with reference to FIG. 2, control path input 8 provides adjustable, hysteretic (i.e., transition-dependent) control of the signal detection function performed by switch point detector 5. As known in the art, a receiver employing hysteretic techniques is generally characterized as having two switch point values differing from one another by a hysteresis or an anti-hysteresis value. A hysterisis-type receiver employs switch points offset from the mid-point input signal voltage such that the resulting low-to-high and high-to-low switch points lag by some delta from a singular (i.e. not transition direction dependent) switch point. Hysterisis receivers are often used to improve noise immunity. Conversely, anti-hysterisis receiver operation employs two distinct and transition-dependent switch point thresholds that result in earlier switching during each input signal transition. As utilized herein, the hysteresis/anti-hysterisis value itself is the difference between the two switch point threshold values. Therefore, if the input signal is measured in volts, the hysteresis/anti-hysterisis value is also expressed in volts. While providing additional noise immunity, hysterisis signal detection produces a skew. On the other hand, an anti-hysterisis detector switches earlier, thus having greater susceptibility to noise while reducing signal detection latency.

Control circuit 15 generally comprises a hysteretic mode circuit 7 coupled to receive the detector output signal from an output node 34 and to provide a level select signal as an input to a level adjust circuit 25 and a branch select module 12. Hysteretic mode circuit 7 comprises circuit and logic means for implementing a hysteretic (i.e. either a hysterisis or anti-hysterisis) switch point operating mode for switch point detector 5. To this end, hysteretic mode circuit 7 includes circuit and logic means for generating on a signal path 19, a level select signal, h_out, having a voltage level or logical value that depends on the present polarity or logic level of the output signal at detector output node 34 in order to effectuate hysteretic (i.e. hysterisis or anti-hysterisis) detector operation. Given the dual switch point nature of hysteretic detection, the level select signal h_out generated by hysteretic mode circuit 7 switches on each transition of the detected signal at output node 34.

The hysteretic mode control of the present invention enables dynamic adjustment of the hyterisis value (i.e. span between alternating switch points) to compensate for manufacturing tolerances, run time operating variations or other conditions necessitating switch point adjustment. The present invention further enables switching between a hysterisis detection mode in which the switch point thresholds lag the nominal mid-level switch point, and an anti-hysterisis detection mode in which the switch point thresholds occur earlier in the signal transitions. At an input 33, hysteretic mode circuit 7 receives a mode select signal, hyst_mode, representing a binary value that is asserted/de-asserted to apply the desired hysteretic mode. Hysteretic mode circuit 7 logically combines the hyst_mode select signal with the presently detected signal level at detector output node 34 to generate the level select h_out signal on signal path 19. The hyst_mode select signal received at input 33 may be design or user-specified or autonomically determined such as is shown in the depicted embodiment in which the hyst_mode select input is set by hysteretic mode select logic 11.

As shown in FIG. 1, the level select signal is input to branch select logic 12, which comprises control logic for individually asserting/de-asserting branch select signals delivered to a level adjust circuit 25 and a switch point mode select circuit 14. The select signals comprise a set of n branch select signals which are processed in conjunction with level-dependent feedback from hysteretic mode circuit 7 to adjustably set the collective beta ratio of a transistor net(s) (depicted in FIG. 2) within switch point detector 5 in an output transition-dependent manner. During autonomic operation, the hysteretic mode as set by hyst_mode at input 33 and/or the hysterisis/anti-hysterisis value for a given mode, may be set and dynamically adjusted in accordance with switch point data 9 derived in part from the detected signal at output node 34. Switch point data 9 may be obtained from on-chip switch point status registers (not depicted) or as some other direct or indirect logical derivation from the detected signal on output node 34.

Whether receiving as input(s) real-time circuit operation data such as from detected signal data 9, or user-specified or pre-programmed switch point adjustment input, control circuit 15 generates as output a set of n branch enable signals, where n corresponds to the number of individually controllable pull-up and pull-down branches within switch point detector 5. Level adjust circuit 25 is coupled to receive as inputs the h_out signal from hysteretic mode circuit 7 and the n branch select signals from branch select logic 12. Level adjust circuit 25 includes circuit and logic means for individually setting each of n branch enable signals as a logical function of the h_out value on signal path 19 and the values of one or more of the n branch select signals output from branch select logic 12. It should be noted that while the depicted embodiment utilizes n branch select signals and n branch enable signals, the present invention may be practiced using other numbers of branch select and/or enable signals.

Control circuit 15 further includes a switch point mode circuit 14 coupled to receive the hysteretic branch enable signals from level adjust circuit 25 and the alternative non-hysteretic branch enable signals from the output of switch point select logic 12. As depicted and explained below with reference to FIG. 2, switch point mode circuit 14 comprises circuit and logic means for selecting either the hysteretic branch enable signals or the non-hysteretic branch enable signals in accordance with a control signal input mode_sel.

Figure 2:
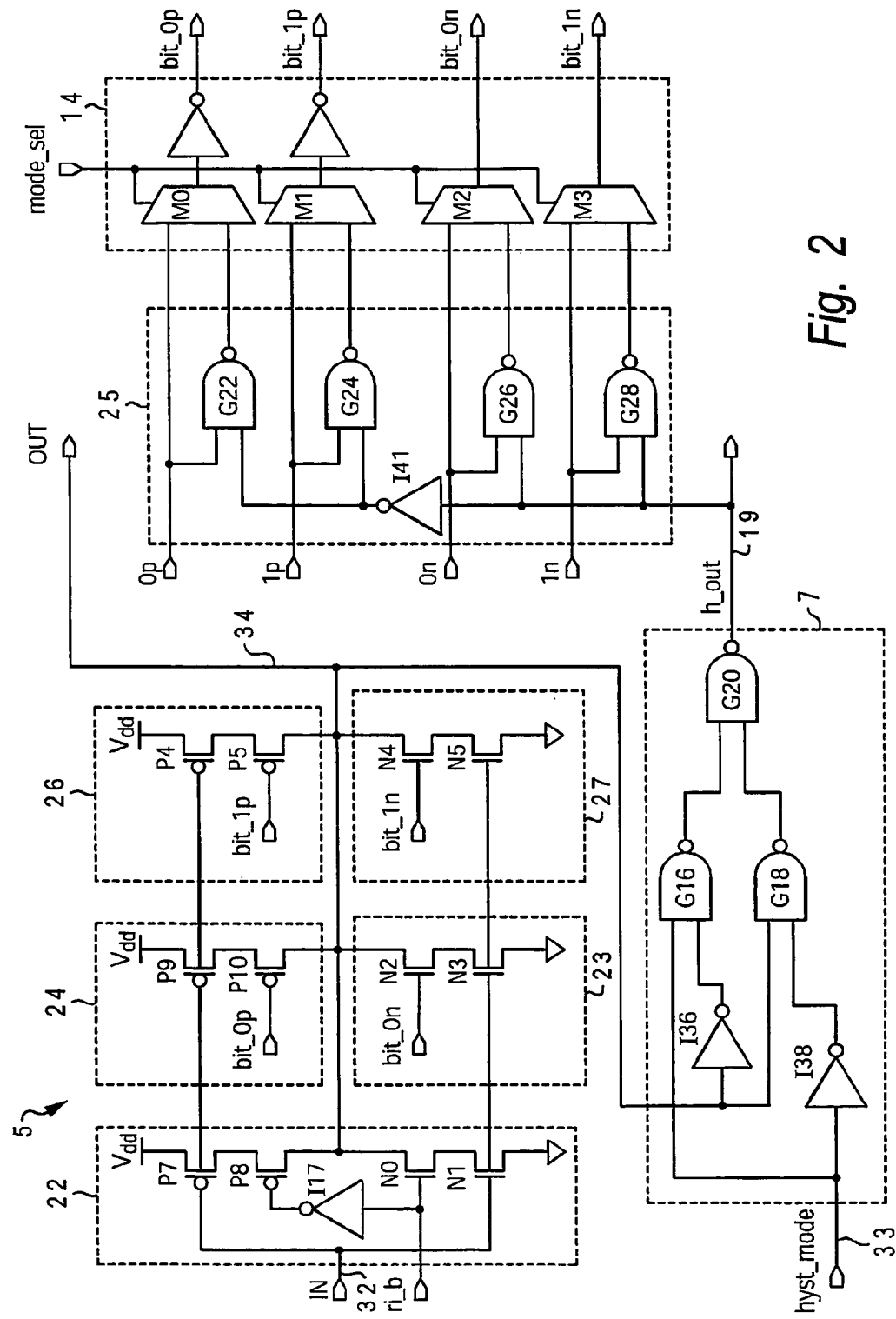
FIG. 2 is a schematic illustration of a circuit for adjustably detecting an input signal such as may be implemented in a digital signal receiver in accordance with the present invention.

Referring to FIG. 2, there is depicted a schematic illustration of a circuit for adjustably detecting an input signal such as may be implemented by digital signal receiver 10 in accordance with the present invention. It should be noted that while the invention is described in FIG. 2 in terms of an illustrative circuit using Complementary Metal Oxide Semiconductor (CMOS) field effect transistors, the present invention should not be construed as limited by the illustrative configurations. Instead, variations to the circuits described herein, as well as, other circuits, transistors and logic standards (e.g., TTL, SSTL, etc.) may be used in alternative embodiments.

The circuit includes switch point detector 5 comprising an array of CMOS field effect transistors (FETs). More specifically, the transistor array includes a P-type transistor net comprising multiple parallel coupled P-type transistor branches serially coupled to an N-type transistor net comprising multiple parallel coupled N-type transistor branches. The P-type and N-type nets are configured as complementary branch pairs comprising multiple pull-up branches 24 and 26 and multiple pull-down branches 23 and 27. Tri-state inverter 22 provides additional pull-up and pull-down branches to the respective nets. The pull-up branch contributed by tri-state inverter 22 comprises source-to-drain coupled PFETs P7 and P8 and the pull-down branch comprises source-to-drain coupled NFETs N0 and N1. The complementary branches of tri-state inverter 22, together with inverter 117 coupled between the gates of P8 and N0, form a tri-state inverter with the gates of transistors P8 and N0 coupled to an enable input, ri_b, the gates of transistors P7 and N1 coupled to a signal detect input 32, and the drains of P8 and N0 coupled to a detector output node 34. Tri-state inverter 22 is enabled by a logic high asserted at enable input ri_b.

Unlike the co-dependently enabled pull-up and pull-down branches of tri-state inverter 22, pull-up branches 24 and 26 and pull-down branches 23 and 27 are each independently controllable having enable inputs bit_0p, bit_1p, bit_0n, and bit_1n such as may be individually set and switched by the branch select module 12 depicted in FIG. 1. In this manner, tri-state inverter 22 provides baseline switching with the independent switching of branches 24, 26, 23 and 27 serving as switch point adjustment branches.

The pull-up branch of tri-state inverter 22 as well as pull-up branches 24 and 26 couple detector output 34 to a first reference voltage, Vdd, and the pull-down branch of tri-state inverter 22 and branches 23 and 27 couple detector output 34 to a second reference voltage, in this case ground. The collective enablement state of the branches controls the current available to drive transitions of detector output 34 in response to voltage transitions at detector input 32.

In the depicted embodiment, each of the pull-up branches includes a pair of PFETs (P7 and P8, P9 and P10, and P4 and P5) coupled in series between detector output 34 and Vdd. The gates of transistors P7, P9 and P4 are coupled to detector input 32, and the gates of transistors P10 and P5 are coupled to receive independently controllable enable signals, bit_0p and bit_1p, respectively. Each of the pull-down branches includes a pair of NFETs (N0 and N1, N2 and N3, and N4 and N5) coupled in series between detector output 34 and ground. The gates of transistors N1, N3, and N5 are coupled to detector input 32, and the gates of transistors N2 and N4 are coupled to receive independently controllable enable signals, bit_0n and bit_1n, respectively.

During circuit operation, pull-up transistors P7, P9, and P4, and pull-down transistors N1, N3, and N5 are switched on and off by a transitioning binary signal received at detector input 32. The activation state of the respective branches enabling coupling between detector output 34 and reference voltages Vdd and ground is controlled by the states of the pull-up transistors P8, P10, and P5, and pull-down transistors N0, N2, and N4, respectively. With the branches of tri-state inverter 22 statically activated by the enable input ri_b, the current flowing into detector output node 34 increases as additional pull-up branches 24, and 26 are activated, i.e. as pull-up transistors P10 and P5, are switched on by branch enable signals bit_0 and bit_1. Similarly, the current flowing out of detector output node 34 increases as additional pull-down branches 23 and 27 are activated using branch enable signals bit_0n and bit_1n to turn on transistors N2 and N4. The operative switch point voltage of detector 5 for a given input signal transition is the voltage at which the current flowing into detector output 34 from the pull-up branch in tri-state inverter 22 and any additional activated pull-up branches exceeds the current flowing out of output 34 through the pull-down branch in tri-state inverter 22 and any additional activated pull-down branches. That is, the operative switch point voltage corresponds to the voltage at detector input 32 for which the net current flow into the detector output node 34 is zero. For example, for high-to-low signal transitions at input 32, the switch-point occurs when the current into output node 34 through all activated pull-up branches exceeds the current out of output node 34 through all activated pull-down branches. The operative switch point voltage of the circuit may thus be controlled by activating and deactivating the independently controllable pull-up and pull-down branches, as needed, to increase the current flow into or out of detector output node 34 for a given voltage at input 32.

The signal detector of the present invention and receiver incorporating the same further comprise a control circuit, such as switch point control circuit 15 shown in FIG. 1, coupled to switch point detector circuit 5. The switch point control circuit shown in FIG. 2 comprises hysteretic mode select circuit 7, level adjust circuit 25, and switch point mode select circuit 14 which include circuit means for generating branch enable signals for selectively enabling and disabling the independently controllable pull-up branches 24 and 26 and pull-down branches 23 and 27 as a function, in part, of the output polarity (i.e. logic high or logic low) of the voltage at detector output 34. As explained below, this output level/transition dependency enables the switch point control circuit to implement an adjustable hysteresis or anti-hysteresis mode of detector operation.

As shown in FIG. 2, the control circuit includes hysteretic mode circuit 7 coupled between the detector output 34 and level adjustment circuit 25. In the depicted embodiment, hysteretic mode circuit 7 comprises inverters 136 and 138 and NAND gates G16, G18, and G20 configured as an XOR logic gate for generating level select signal h_out on signal path 19 as a function of the signal level at detector output 34 and the hyst_mode signal input 33. Anti-hysterisis mode commences when hyst_mode input 33 is de-asserted (i.e. asserted to a logic low) and hysterisis mode when input 33 is asserted high. In anti-hysterisis mode, the h_out level select signal on signal path 19 follows the logic level at detector output 34, while in hysterisis mode the polarity of h_out is opposite that of detector output 34 as shown in the following logic.

(a)

| hyst_mode | detect out | h_out |
|---|---|---|
| anti-hyst { 0 | 0 | 0 |
| 0 | 1 | 1 |
| hyst { 1 | 0 | 1 |
| 1 | 1 | 0 |

In accordance with the depicted embodiment, level adjust circuit 25 includes NAND gates G22 and G24 that receive the h_out level select signal (inverted via inverter 141) as a common input with G22 also receiving a branch select input, 0$p$, corresponding to the bit_0$p$ enable input of pull-up branch 24, and G24 receiving a branch select input, 1$p$, corresponding to the bit_1$p$ enable input of pull-up branch 26. Level adjust circuit 25 further includes NAND gates G26 and G28 that receive h_out as a common input with G26 also receiving a branch select input, 0$n$, corresponding to the bit_0$n$ enable input of pull-down branch 23, and G28 receiving a branch select input, 1$n$, corresponding to the bit_1$n$ enable input of pull-down branch 27.

In the depicted configuration, level adjust circuit 25 processes the h_out signal and its complement in concert with the individually specified branch select inputs 0$p$, 1$p$, 0$n$, and 1$n$ (such as may be pre-specified or dynamically determined and adjusted by the branch select module 12 shown in FIG. 1) to generate hysteretic branch enable signals for each of the independently controllable pull-up and pull-down branches. As shown in FIG. 2, the h_out signal and its complement are logically NANDed with the branch select inputs 0$p$, 1$p$, 0$n$, and 1$n$ within level adjust circuit 25 to generate a set of hysteretic branch enable signals that are selectably coupled to branch enable inputs bit_0$p$, bit_1$p$, bit_0$n$ and bit_1$n$ to provide independent controllability of adjustment branches 22, 26, 23, and 27. For ease of reference, "bit_0$p$", "bit$_{13}$ 1$p$", "bit_0$n$" and "bit_1$n$" will be interchangeably used to refer to the branch enable inputss or the corresponding branch enable signals carried thereon. An example of the operation of level adjust circuit 25 in generating hysteretic branch enable signals applied to branch enable inputs bit$_{13}$ 0$p$ and bit_0$n$ as a function of the level select signal h_out and the corresponding branch select inputs 0$p$ and 0$n$ is depicted in the following logic.

(b)

| h_out | 0p | bit_0p |
|---|---|---|
| 0 | 0 | 0 |
| 0 | 1 | 1 |
| 1 | 0 | 0 |
| 1 | 1 | 0 |

(c)

| h_out | 0n | bit_0n |
|---|---|---|
| 0 | 0 | 1 |
| 0 | 1 | 1 |
| 1 | 0 | 1 |
| 1 | 1 | 0 |

As shown in the foregoing logic diagram (b), when h_out is a logic low, the hysteretic branch enable signal bit_0$p$ follows the branch select signal 0$p$. Similarly configured, branch enable signal bit_1$p$ also follows its desginated non-hysteretic branch select signal 1$p$ when h_out is a logic low. As shown in logic diagram (c), the pull-down branch enable signals bit_0$n$ and bit_1$n$ are both switched high when h_out is a logic low, thus enabling both adjustable pull-down branches 23 and 27. Conversely, when h_out is a logic high, both pull-up branches 24 and 26 are enabled (i.e. both bit_0$p$ and bit_1$p$ are set to a logic low) and the pull-down enable signals bit_0$n$ and bit_1$n$ follow the complement of h_out. In the foregoing manner, during anti-hysterisis mode (hyst_mode logic low in the depicted embodiment) a low-to-high transition switch point voltage is set by level adjust circuit 25 such that pull-up branches 24 and 26 are individually controlled by branch select signals 0$p$ and 1$p$ while pull-down branches 23 and 27 are switched on independent of the branch select inputs 0$n$ and 1$n$. In this state, all pull-down branches are conducting and contributing to lowering the collective beta ratio, hence the detector switch point is lowered consistent with anti-hysteresis operation for a low-to-high transition.

An anti-hysterisis high-to-low switch point voltage is set by level adjust circuit 25 such that all pull-up branches are switched on independently of branch select signals p0 and p1, raising the collective beta ratio and resulting in earlier switching of the detector. The pull-down branches 23 and 27 are independently controlled via individual setting of branch select signals 0$n$ and in to selectively adjust the anti-hysteris to a desired value for high-to-low transitions.

With continued reference to FIG. 2 and logic diagrams (a)–(c), during hysterisis mode (hyst_mode asserted high in the depicted embodiment) a low-to-high transition switch point voltage is set by level adjust circuit 25 such that the adjustment pull-up branches 24 and 26 are switched on independent of the branch select inputs while pull-down branches 23 and 27 are individually controlled by branch select signals 0$n$ and 1$n$. In this state, all pull-up branches are conducting and contributing to raising the collective beta ratio and hence the detector switch point consistent with hysterisis operation for a low-to-high transition.

Conversely, a hysterisis mode high-to-low transition switch point voltage is set by level adjust circuit 25 such that the pull-down branches 23 and 27 are switched on independently of branch select signals n0 and n1, lowering the collective beta ratio and resulting in later switching of the detector. The pull-up branches 24 and 26 are independently controlled via individual setting of branch select signals 0$p$ and 1$p$ to selectively adjust the hysterisis value to a desired level for high-to-low transitions.

Given the independent controllability of branch select signals 0$p$, 1$p$, 0$n$, and 1$n$, and assuming feedback from the detector output 34 to switch point select logic 12 (FIG. 1), the switch point value can be set uniformly (i.e. same for both low-to-high and high-to-low transitions) or in a transition dependent manner.

As further depicted in FIG. 2, the hysteretic branch enable signals generated by level adjust circuit 25 and the corresponding non-hysteretic branch select signals 0$p$, 1$p$, 0$n$ and 1$n$ are applied as inputs to switch mode circuit 14. Switch point mode circuit 14 generally comprises circuit and logic means for selectively applying either the hysteretic or the non-hysteretic branch enable signals to the corresponding branch enable inputs. As shown in FIG. 2, a switch point mode select input, mode_sel, is used in conjunction with signal select means in the form of multiplexers M0, M1, M2 and M3 to select between hysteretic or non-hysteretic switch point operation.

The disclosed devices and systems may be implemented partially or fully in hardware using CMOS logic circuits within, for example, a VLSI design. Whether software is utilized to support hardware in implementing receiver switch point control in accordance with this invention is dependent on the speed and/or efficiency requirements of the system, the particular function, and the particular software or hardware systems or data processing systems being utilized. The receiver switch point control systems and methods described above, however, can be readily implemented in hardware and software using any known or later-developed systems or structures, devices and/or software by those skilled in the applicable art without undue experimentation from the functional description provided herein together with a general knowledge of the computer arts.

While the invention has been particularly shown and described with reference to a preferred embodiment, it will be understood by those skilled in the art that various changes in form and detail may be made therein without departing from the spirit and scope of the invention. These alternate implementations all fall within the scope of the invention.

What is claimed is:

1. A digital signal receiver comprising:
    a switch point detector that detects binary logic transitions of an input binary signal, said switch point detector including multiple switch point control branches; and
    a control circuit coupled to said switch point detector, said control circuit generating branch enable signals coupled to branch enable inputs of said multiple switch point control branches for selectively enabling or disabling said multiple switch point control branches to effectuate hysterisis or anti-hysterisis control of said detector output.

2. The digital signal receiver of claim 1, wherein said multiple switch point control branches comprise one or more pull-up branches and one or more pull-down branches having individually controllable branch enable inputs.

3. The digital signal receiver of claim 2, wherein said multiple switch point control branches further comprise a tri-state inverter having co-dependently enabled pull-up and pull-down branches.

4. The digital signal receiver of claim 2, wherein said one or more pull-up branches and said one or more pull-down branches comprise serially coupled transistor nets.

5. The digital signal receiver of claim 1, wherein said control circuit includes a hysteretic mode circuit communicatively coupled to said detector output, said hysteretic mode circuit including circuitry or logic that generates a level select signal as a function of the signal polarity at a detector output of said switch point detector and a hysteretic mode select signal, wherein said level select signal is processed by said control circuit to generate said branch enable signals.

6. The digital signal receiver of claim 5, further comprising logic for setting said hysteretic mode select signal in accordance with switch point feedback data.

7. The digital signal receiver of claim 5, wherein said hysteretic mode circuit includes circuit or logic means that sets said level select signal to selectively enable or disable said multiple switch point control branches such that said switch point detector operates in a hysterisis or an anti-hysterisis mode.

8. The digital signal receiver of claim 5, said hysteretic mode circuit including circuit means for generating said level select signal as a XOR logic function or a XNOR logic function of said hysteretic mode select signal and a signal level at said detector output.

9. The digital signal receiver of claim 5, wherein said control circuit further includes a level adjust circuit coupled to said hysteretic mode circuit and which generates said branch enable signals as a logical function of said level select signal and one or more branch select signals.

10. The digital signal receiver of claim 9, said control circuit further including a switch point mode circuit coupled between the output of said level adjust circuit and the enable inputs of said multiple switch point control branches, said switch point mode circuit including logic for selectively applying either the branch enable signals generated by said level adjust circuit or the branch select signals to the enable inputs of said multiple switch point control branches.

11. The digital signal receiver of claim 9, wherein said control circuit further includes branch select logic coupled between said detector output and said level adjust circuit, said branch select logic including logic that asserts or de-asserts one or more of said branch select signals as a function of switch point feedback data.

12. The digital signal receiver of claim 11, wherein said branch select logic receives as an input said level select signal, said branch select logic further comprising logic for asserting or de-asserting one or more of said branch select signals as a function of said level select signal.

13. A circuit for adjustably detecting an input binary signal comprising:
    a switch point detector that detects binary logic level transitions of an input binary signal, said switch point detector including a transistor array comprising one or more pull-up branches and one or more pull-down branches, each of said one or more pull-up branches and one or more pull-down branches having a signal detect input at which said input binary signal is received and an enable input for enabling or disabling switching of said one or more pull-up branches and said one or more pull-down branches; and
    a control circuit coupled between an output node of said switch point detector and the enable inputs of the one or more pull-up branches and one or more pull-down branches, said control circuit providing level-dependent branch enable signals for enabling or disabling said one or more pull-up branches and said one or more pull-down branches as a function of the logic level at the output node of said switch point detector.

14. The circuit of claim 13, wherein said control circuit comprises hyteretic mode logic that generates a level select signal as a function of the signal level at said output node and a hysteretic mode select signal, said level select signal processed by said control circuit to set said branch enable signals such that said circuit operates in a hysterisis or anti-hysterisis mode.

15. The circuit of claim 13, wherein said one or more pull-up branches and said one or more pull-down branches form serially coupled, complementary transistor nets.

16. The circuit of claim 15, wherein the complementary transistor nets are formed as CMOS transistor configurations.

17. The circuit of claim 14, wherein said control circuit further includes a level adjust circuit coupled to said hysteretic mode circuit and which generates said branch enable signals as a logical function of said level select signal and one or more branch select signals.

* * * * *